United States Patent
Oka et al.

(10) Patent No.: US 11,563,304 B2
(45) Date of Patent: Jan. 24, 2023

(54) LIGHTING MODULE, DISTANCE MEASURING DEVICE, MOVABLE BODY, AND LIGHT SOURCE DRIVE CIRCUIT

(71) Applicants: Yuuki Oka, Miyagi (JP); Takumi Satoh, Miyagi (JP); Tsuyoshi Ueno, Kanagawa (JP); Atsufumi Omori, Kanagawa (JP)

(72) Inventors: Yuuki Oka, Miyagi (JP); Takumi Satoh, Miyagi (JP); Tsuyoshi Ueno, Kanagawa (JP); Atsufumi Omori, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 38 days.

(21) Appl. No.: 17/305,606

(22) Filed: Jul. 12, 2021

(65) Prior Publication Data

US 2022/0037853 A1    Feb. 3, 2022

(30) Foreign Application Priority Data

Jul. 29, 2020    (JP) .............................. JP2020-128661

(51) Int. Cl.
| | |
|---|---|
| *H05B 47/11* | (2020.01) |
| *H01S 5/04* | (2006.01) |
| *H01S 5/042* | (2006.01) |
| *G01S 17/10* | (2020.01) |
| *G01S 7/484* | (2006.01) |

(52) U.S. Cl.
CPC ............ *H01S 5/0428* (2013.01); *G01S 7/484* (2013.01); *G01S 17/10* (2013.01); *H05B 47/11* (2020.01)

(58) Field of Classification Search
CPC ...... H05B 47/10; H05B 47/105; H05B 47/11; H05B 45/00; H05B 45/30; H05B 45/32; H05B 45/325; G01S 7/484; G01S 17/10; H01S 5/0428; H01S 5/02; H01S 5/0608
See application file for complete search history.

(56) References Cited

U.S. PATENT DOCUMENTS

| | | | |
|---|---|---|---|
| 10,574,026 B2 * | 2/2020 | Mignoli | ................. G01S 7/484 |
| 2003/0035451 A1 | 2/2003 | Ishida et al. | |
| 2004/0183891 A1 | 9/2004 | Ishida et al. | |
| 2005/0213623 A1 | 9/2005 | Ozasa et al. | |

(Continued)

FOREIGN PATENT DOCUMENTS

JP        2015-179436         10/2015

*Primary Examiner* — Jimmy T Vu
(74) *Attorney, Agent, or Firm* — IPUSA, PLLC

(57) ABSTRACT

A lighting module includes a voltage-current controller to control power externally supplied, a capacitor charged with power supplied from the voltage-current controller, a laser light source to emit laser light driven by a current from the capacitor, first and second FETs electrically connected in series to the laser light source, and circuitry that controls a first voltage value applied to the first FET and a second voltage value applied to the second FET, to control a resistance value of the second FET. The first FET controls a pulse width of the current flowing through the laser light source in accordance with the first voltage value applied to a gate thereof. The second FET changes in resistance value in accordance with the second voltage value applied to a gate thereof and controls, with the resistance value, a peak value of the current flowing through the laser light source.

14 Claims, 13 Drawing Sheets

(56) References Cited

U.S. PATENT DOCUMENTS

| | | |
|---|---|---|
| 2011/0064098 A1 | 3/2011 | Omori et al. |
| 2011/0199657 A1 | 8/2011 | Ishida et al. |
| 2011/0222313 A1 | 9/2011 | Ueno |
| 2014/0139603 A1 | 5/2014 | Fujita et al. |
| 2014/0139605 A1 | 5/2014 | Fujita et al. |
| 2014/0312233 A1* | 10/2014 | Mark .............. H05B 45/37 250/341.8 |
| 2015/0180200 A1 | 6/2015 | Fujita et al. |
| 2018/0269651 A1 | 9/2018 | Oka et al. |
| 2018/0335682 A1 | 11/2018 | Satoh et al. |
| 2019/0280454 A1 | 9/2019 | Ikeoh et al. |
| 2020/0160777 A1 | 5/2020 | Ueno et al. |
| 2020/0178361 A1 | 6/2020 | Oka |
| 2021/0013703 A1 | 1/2021 | Numata et al. |
| 2021/0124046 A1 | 4/2021 | Satoh et al. |
| 2021/0149023 A1 | 5/2021 | Ohta et al. |

\* cited by examiner

LIGHTING MODULE, DISTANCE MEASURING DEVICE, MOVABLE BODY, AND LIGHT SOURCE DRIVE CIRCUIT

CROSS-REFERENCE TO RELATED APPLICATION

This patent application is based on and claims priority pursuant to 35 U.S.C. § 119(a) to Japanese Patent Application No. 2020-128661, filed on Jul. 29, 2020, in the Japan Patent Office, the entire disclosure of which is incorporated by reference herein.

BACKGROUND

Technical Field

Embodiments of this disclosure relate to a lighting module, a distance measuring device, a movable body, and a light source drive circuit.

Related Art

For a drive circuit that drives a light-emitting element, there is a technology of adjusting the gate voltage of a field effect transistor (FET), to adjust the pulse width of a pulse current. With such a technology, the drive circuit can adjust the pulse width of the optical output of the light-emitting element without replacing a component or adjusting a circuit constant.

SUMMARY

An embodiment of the present disclosure provides a lighting module that includes a voltage-current controller to control a voltage value and a current value of power supplied from an external power supply, a capacitor to be charged with power supplied from the voltage-current controller, a laser light source to emit laser light driven by a current from the capacitor, first and second FETs electrically connected in series to the laser light source, and circuitry to control a first voltage value applied to the first FET and a second voltage value applied to the second FET, so as to control a resistance value of the second FET. The first FET controls a pulse width of the current flowing through the laser light source in accordance with the first voltage value applied to a gate thereof. The second FET changes in resistance value in accordance with the second voltage value applied to a gate thereof and controls, with the resistance value, a peak of the current flowing through the laser light source.

Another embodiment of the present disclosure provides a light source drive circuit to drive a laser light source. The light source drive circuit includes a capacitor to be charged with power supplied from an external power supply, to accumulate power supplied to the laser light source, and first and second FETs electrically connected in series to the laser light source. The first FET controls a pulse width of a current flowing through the laser light source in accordance with a first voltage value applied to a gate of the first field effect transistor. The second FET changes in resistance value in accordance with a second voltage value applied to a gate of the second field effect transistor, and controls, with the resistance value, a peak value of the current flowing through the laser light source.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

Figure 1:
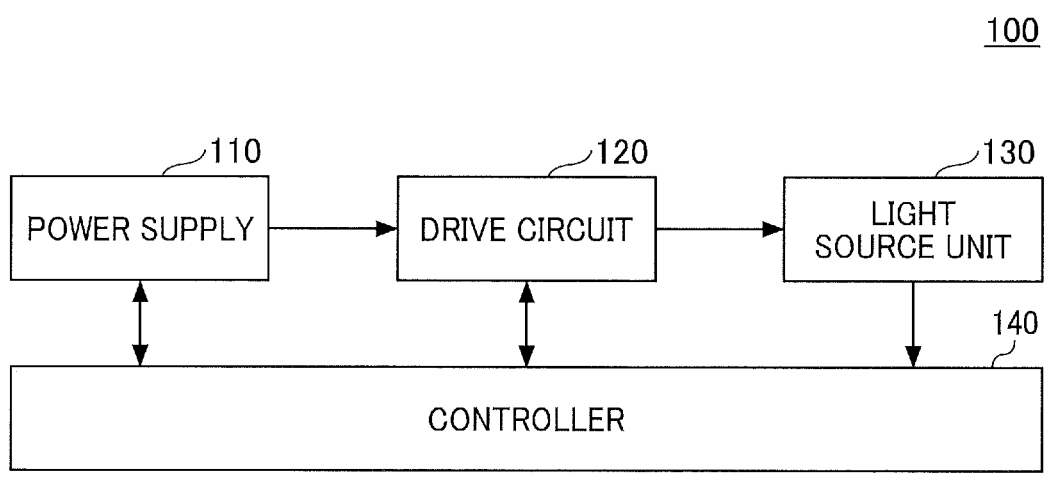
FIG. 1 is a block diagram illustrating a general arrangement of a lighting module according to one embodiment of the present disclosure.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Referring now to the drawings, embodiments of the present disclosure are described below. As used herein, the singular forms "a," "an," and "the" are intended to include the plural forms as well, unless the context clearly indicates otherwise.

General Arrangement of Lighting Module FIG. 1 is a block diagram illustrating a general arrangement of a lighting module 100 according to the present embodiment of the present disclosure. The lighting module 100 illustrated in FIG. 1 is capable of stably outputting light at high speed and high power. For example, the lighting module 100 is used in a light source that performs distance sensing using a time of flight (ToF) method.

As illustrated in FIG. 1, the lighting module 100 includes a power supply 110, a drive circuit 120, a light source unit 130, and a controller 140.

Figure 2:
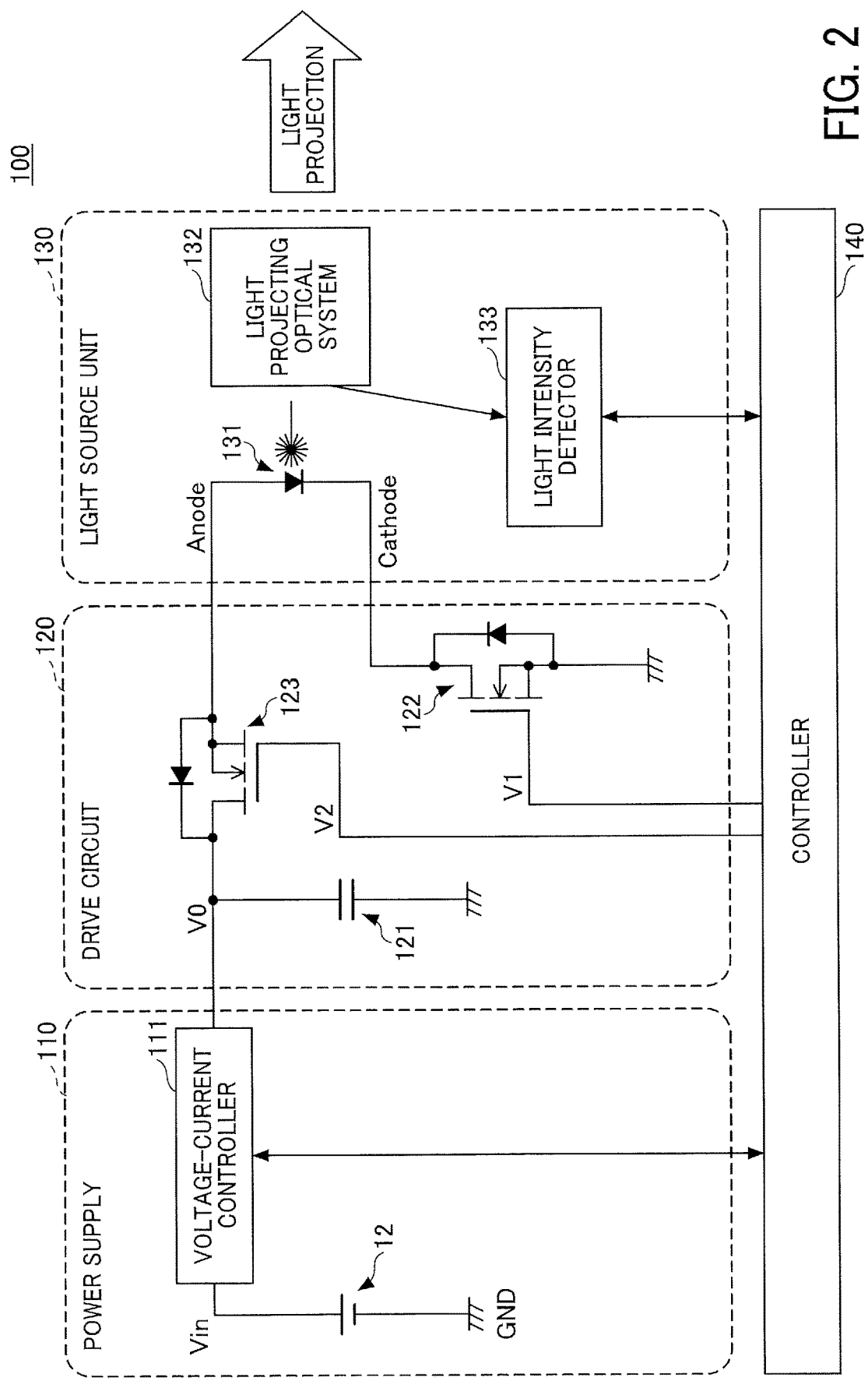
FIG. 2 is a block diagram illustrating a circuit configuration of the lighting module illustrated in FIG. 1.

The power supply 110 generates an output voltage and an output current using power supplied from an external power supply 12 (see FIG. 2). The power supply 110 supplies the generated output voltage and output current to the drive circuit 120. The controller 140 controls the voltage value of the output voltage and the current value of the output current supplied to the drive circuit 120.

The drive circuit 120 is an example of a "light source drive circuit." The drive circuit 120 supplies a current to the light source unit 130 using power supplied from the power supply 110. The supplied current is used by a laser light source 131 of the light source unit 130 to emit light (a current corresponding to illuminance and light emission timing). The controller 140 controls the current value of the current supplied to the drive circuit 120.

The light source unit 130 includes the laser light source 131 (see FIG. 2). Driven by the current supplied from the drive circuit 120, the laser light source 131 emits laser light (pulsed light).

The controller 140 controls the light emission timing of the laser light source 131 in accordance with the exposure timing of a light receiving sensor such as a TOF sensor. The controller 140 performs feedback control of the current flowing to each block and stops the current according to a detection signal indicating a decrease in the light intensity of the laser light source 131, an abnormal output of the laser light source 131, or the like. For example, the controller 140 is implemented by the light receiving sensor such as a TOF sensor and an integrated circuit (IC) chip, a logic device, or a combination of an IC chip and a logic device. Examples of the IC chip includes a large scale integration (LSI) chip and a microprocessor. Example of the logic device includes a field-programmable gate array (FPGA).

Circuit Configuration of Lighting Module

FIG. 2 is a circuit diagram illustrating a circuit configuration of the lighting module 100 according to the present embodiment of the present disclosure.

The power supply 110 includes a voltage-current controller 111. The voltage-current controller 111 performs step-up control or step-down control of voltage Vin supplied from the external power supply 12, so as to output a direct current (DC) voltage V0 having a voltage value or a current value set by the controller 140. An example of the voltage-current controller 111 is a switching control DC-DC converter capable of performing one or both of step-up control and step-down control based on an output voltage or an output current.

The drive circuit 120 includes a capacitor 121, a first FET 122, and a second FET 123.

The capacitor 121 is an example of a "charge storage device." A first end of the capacitor 121 is connected to the output of the voltage-current controller 111, and a second end thereof is grounded. The capacitor 121 is charged with electric power (DC voltage V0) supplied from the voltage-current controller 111. Examples of the capacitor 121 include a low equivalent series inductance (ESL) monolithic ceramic capacitor and electrolytic capacitor. Note that the capacitor 121 may be constructed of a plurality of capacitors connected in parallel.

The gate of the first FET 122 is connected to the controller 140. The drain of the first FET 122 is connected to the cathode of the laser light source 131 of the light source unit 130. The source of the first FET 122 is grounded. That is, the first FET 122 is electrically connected in series between the cathode of the laser light source 131 and the ground. The controller 140 controls a first voltage value V1 supplied to the gate of the first FET 122, thereby controlling turning on and off of the first FET 122. Thus, the first FET 122 controls the pulse width of the current flowing through the laser light source 131. The controller 140 includes a high-speed and high-power gate drive circuit to charge the gate voltage of the first FET 122 at high speed. Alternatively, the gate drive circuit may be provided in the drive circuit 120.

The gate of the second FET 123 is connected to the controller 140. The drain of the second FET 123 is connected to one end of the capacitor 121. The source of the second FET 123 is connected to the anode of the laser light source 131 of the light source unit 130. That is, the second FET 123 is electrically connected in series between the capacitor 121 and the anode of the laser light source 131. The second FET 123 functions as a variable resistor. The controller 140 controls a second voltage value V2 supplied to the gate of the second FET 123, to change the resistance value of the second FET 123. Thus, the second FET 123 controls the peak value of the current flowing through the laser light source 131.

In the present embodiment, each of the first FET 122 and the second FET 123 is a small semiconductor switch manufactured using a wide bandgap material. As one example, in the present embodiment, each of the first FET 122 and the second FET 123 is a gallium nitride (GaN) FET manufactured using GaN having a wide bandgap of 3.4 eV. Thus, the lighting module 100 according to the present embodiment can drive the laser light source 131 at a relatively high drive frequency (several hundreds MHz) and reduce (speedup) the rise time in driving the laser light source 131. Each of the first FET 122 and the second FET 123 may be a plurality of FETs connected in parallel or in series.

The light source unit 130 includes the laser light source 131, a light projecting optical system 132, and a light intensity detector 133. The laser light source 131 has the anode connected to the source of the second FET 123 and the cathode connected to the drain of the first FET 122. That is, the laser light source 131 is electrically connected in series between the first FET 122 and the second FET 123. The laser light source 131 emits light, driven by a current controlled by the first FET 122 and the second FET 123. The laser light source 131 is, for example, a single light source using an edge-emitting laser (EEL), a vertical cavity surface-emitting laser (VCSEL), or a light emitting diode (LED); or a plurality of light sources (for example, a VCSEL array light source) that simultaneously emits light. In the present embodiment, a surface-emitting laser or an edge-emitting laser is used as the laser light source 131. The light projecting optical system 132 changes an angle of view, an irradiation range, and the like of the laser light (pulsed light) emitted from the laser light source 131. Examples of the light projecting optical system 132 include a lens optical system and a micro optical system. The light intensity detector 133 detects the intensity of laser light (pulsed light) emitted from the laser light source 131. The light intensity detector 133 performs feedback of the detected intensity of light to the controller 140. For example, a light-receiving element such as a photodiode is used as the light intensity detector 133.

In the lighting module 100 according to the present embodiment, the controller 140 controls the second voltage value V2 supplied to the gate of the second FET 123, to change the resistance value of the second FET 123. Thus, the controller 140 can control the peak value of the current flowing through the laser light source 131. In particular, the lighting module 100 according to the present embodiment can reduce the inductance of the variable resistors by using the second FET 123 as the variable resistor. With this structure, the lighting module 100 can control, in real time, changes in the current corresponding to the light emission intensity of the laser light source 131, and can stabilize the light emission intensity of the laser light source 131.

In the lighting module 100 according to the present embodiment, each of the first FET 122 and the second FET 123 is small semiconductor switch is manufactured using a material having a wide bandgap of, e.g., equal to or greater than 3 electron-volts (eV). Thus, in the lighting module 100, use of the small-sized semiconductor switch can reduce the inductance, and use of a wide bandgap material can reduce the parasitic capacitance so as to increase the speed in changing the current value of the pulse current.

In addition, the lighting module 100 according to the present embodiment includes the light intensity detector 133 that detects the intensity of laser light (pulsed light) emitted from the laser light source 131, and the controller 140 can control the second voltage value V2 applied to the second FET 123 corresponding to the intensity of light detected by the light intensity detector 133. With this configuration, the lighting module 100 can perform feedback control so as to keep the FET light intensity constant, and stabilize the accuracy in range finding. In addition, the lighting module 100 can detect the occurrence of a failure in the light projecting optical system 132.

The lighting module 100 according to one embodiment uses a surface-emitting laser as the laser light source 131. In this case, the lighting module 100 can reduce temperature dependence of wavelength shift, thereby improve the stability of the range finding accuracy.

The lighting module 100 according to another embodiment uses an edge-emitting laser as the laser light source 131. In this case, the lighting module 100 can easily achieve high power and can perform range finding of longer distance.

Figure 3:
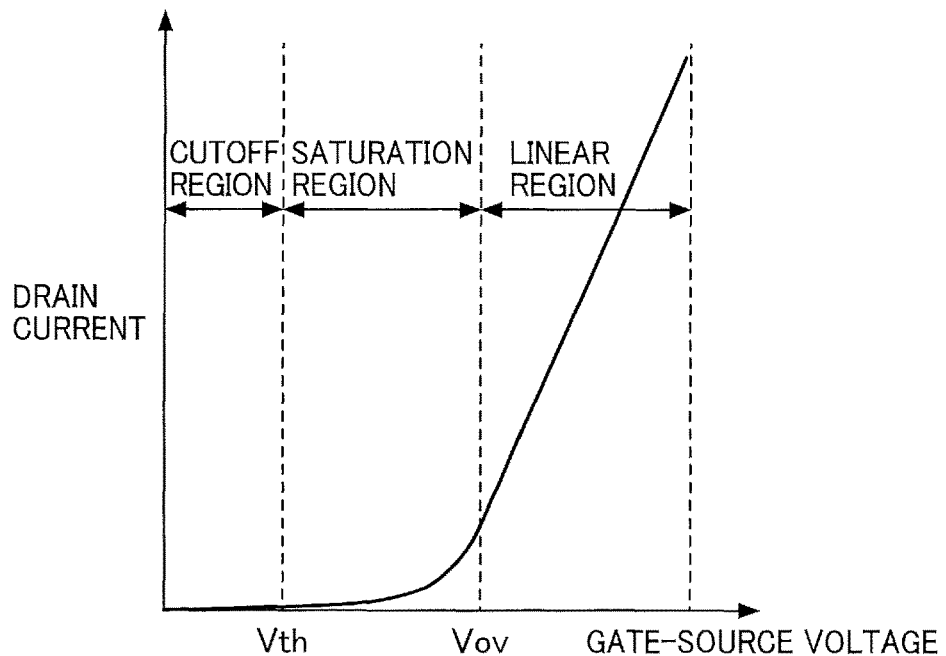
FIG. 3 is a graph illustrating a relationship between a gate-source voltage and a drain current in a first FET and a second FET according to one embodiment.

FIG. 3 is a graph illustrating a relationship between a gate-source voltage and a drain current in the first FET 122 and the second FET 123 according to the present embodiment. As illustrated in FIG. 3, the gate-source voltage of each of the first FET 122 and the second FET 123 has a cutoff region, a saturation region, and a linear region. In the cutoff region, the gate-source voltage is not applied, and the drain current does not flow. The saturation region of the gate-source voltage is the region exceeding a first threshold voltage Vth. In the saturation region, the current starts flowing. In the saturation region, a drain current corresponding to the gate-source voltage flows. The linear region of the gate-source voltage is the region exceeding a second threshold voltage Vov. In the linear region, a drain current corresponding to the gate-source voltage flows. The controller 140 switches the gate-source voltages of the first FET 122 and the second FET 123 between the voltage value in the linear region (greater than the second threshold voltage Vov) and the voltage value in the cutoff region (smaller than the first threshold voltage Vth) based on the characteristics of the first FET 122 and the second FET 123. Thus, the controller 140 can switch the first FET 122 and the second FET 123 between ON and OFF.

Figure 4:
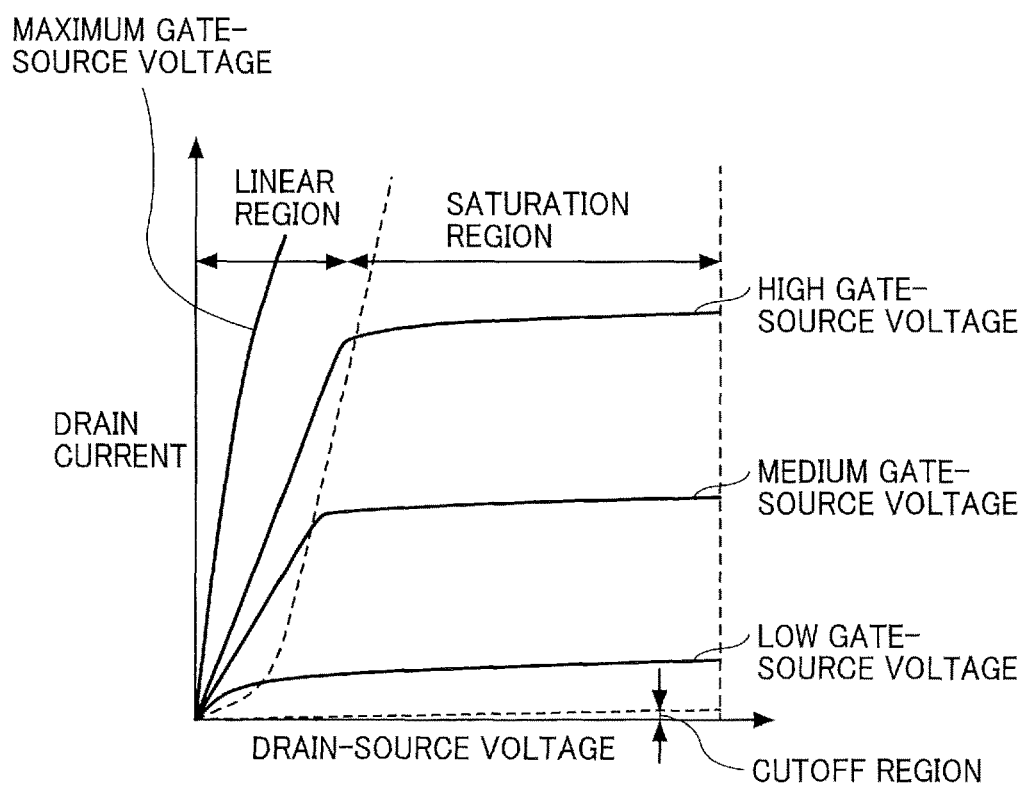
FIG. 4 is a graph illustrating a relationship between a drain-source voltage and a drain current in the first FET and the second FET according to one embodiment.

FIG. 4 is a graph illustrating a relationship between a drain-source voltage and a drain current in the first FET 122 and the second FET 123 according to the present embodiment. FIG. 4 illustrates output characteristics of the first FET 122 and the second FET 123 (the relationship between the drain-source voltage and the drain current) when a plurality of gate-source voltage values ("maximum," "high," "medium," and "low") are applied to the first FET 122 and the second FET 123. In the output characteristics of the first FET 122 and the second FET 123, as illustrated in FIG. 4, the relationship between the drain-source voltage and the drain current changes corresponding to the gate-source voltage. As illustrated in FIG. 4, in the first FET 122 and the second FET 123, as the gate-source voltage increases, the slope in the linear region increases, that is, the on-resistance between the drain and the source decreases. Therefore, with application of a high gate-source voltage so as to increase the slope of the cutoff region, the first FET 122 and the second FET 123 can control switching of the gate-source voltage between the cutoff region (OFF) and the linear region (ON), thereby turning on and off and the current flowing to the FET.

Figure 5:
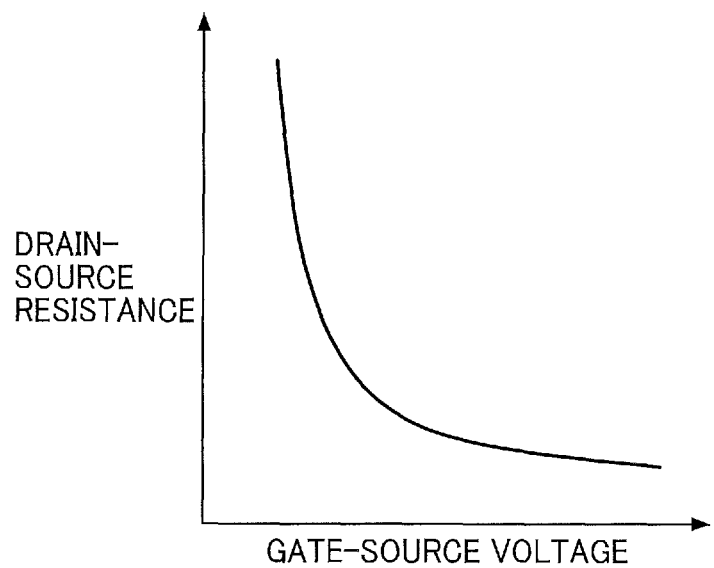
FIG. 5 is a graph illustrating a relationship between a gate-source voltage and a drain-source resistance in the first FET and the second FET according to one embodiment.

FIG. 5 is a graph illustrating a relationship between a gate-source voltage and a drain-source resistance in the first FET 122 and the second FET 123 according to the present embodiment. In the first FET 122 and the second FET 123 according to the present embodiment, when the gate-source voltage value is varied as illustrated in FIG. 4, the slope of the output characteristics (relation between the drain-source voltage and the drain current) in the linear region represents the on-resistance between the drain and the source. Therefore, as illustrated in FIG. 5, in the first FET 122 and the second FET 123 according to the present embodiment, the drain-source resistance can be changed by controlling the gate-source voltage.

Figure 6:
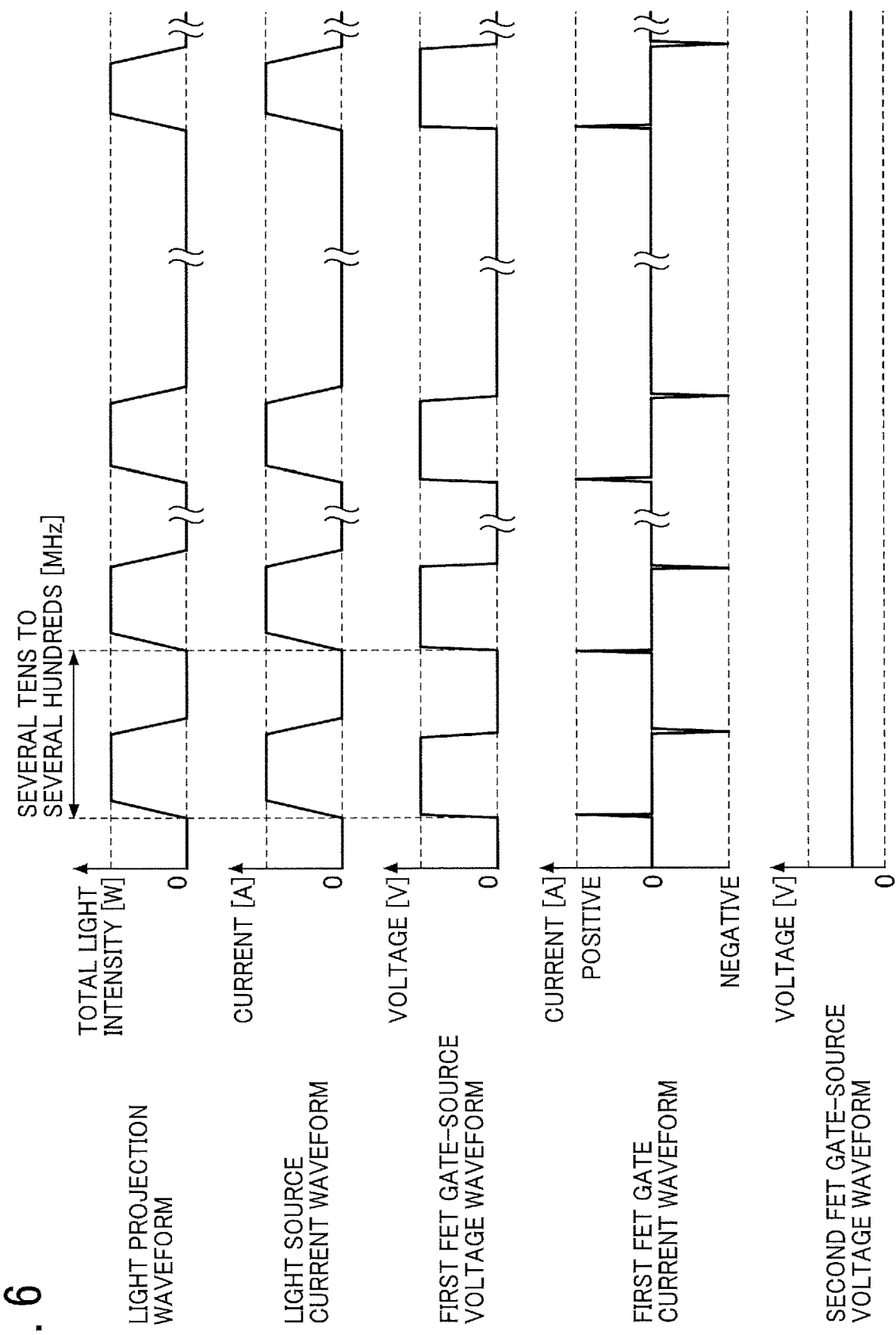
FIG. 6 is a diagram illustrating an example of control of a gate voltage of an FET according to one embodiment.

Example of Control of Gate Voltage FIG. 6 is a chart illustrating an example of control of gate voltages of the first FET 122 and the second FET 123 according to the present embodiment. In the lighting module 100 according to the present embodiment, as illustrated in FIG. 6, the controller 140 controls the gate voltage of each of the first FET 122 and the second FET 123, to control the current flowing to the laser light source 131. Accordingly, as illustrated in FIG. 6, the lighting module 100 according to the present embodiment can control the light output and the light emission waveform of the laser light source 131.

In the lighting module 100 according to the present embodiment, the controller 140 switches the gate voltage of the first FET 122 between the voltage value in the linear region and the voltage value in the cutoff region, thereby switching on and off of the first FET 122.

In order to switch the first FET 122 at high speed, the influence of the parasitic capacitance (gate capacitance or the like) of the first FET 122 should be considered for driving the first FET 122 by the controller 140.

In particular, due to the influence of the parasitic capacitance (gate capacitance or the like) of the first FET 122, there may be a case where the first FET 122 is not turned on (not change to the saturation region) by application of a gate voltage thereto, due to an RC time constant.

Therefore, the controller 140 charges the gate voltage of the first FET 122 with the gate drive circuit. The gate drive circuit is a circuit capable of instantaneously charging and discharging the parasitic capacitance of the first FET 122 with a large current. Accordingly, the controller 140 can charge the gate voltage of the first FET 122 at high speed.

In the lighting module 100 according to the present embodiment, the controller 140 actively controls the gate-source voltage of the second FET 123 in the linear region of the second FET 123 to cause the second FET 123 to operate as a variable resistor. In particular, the controller 140 can lower the resistance value of the second FET 123 by increasing the gate voltage of the second FET 123, and can raise the resistance value of the second FET 123 by decreasing the gate voltage of the second FET 123.

Example of Current Waveform

Figure 7:
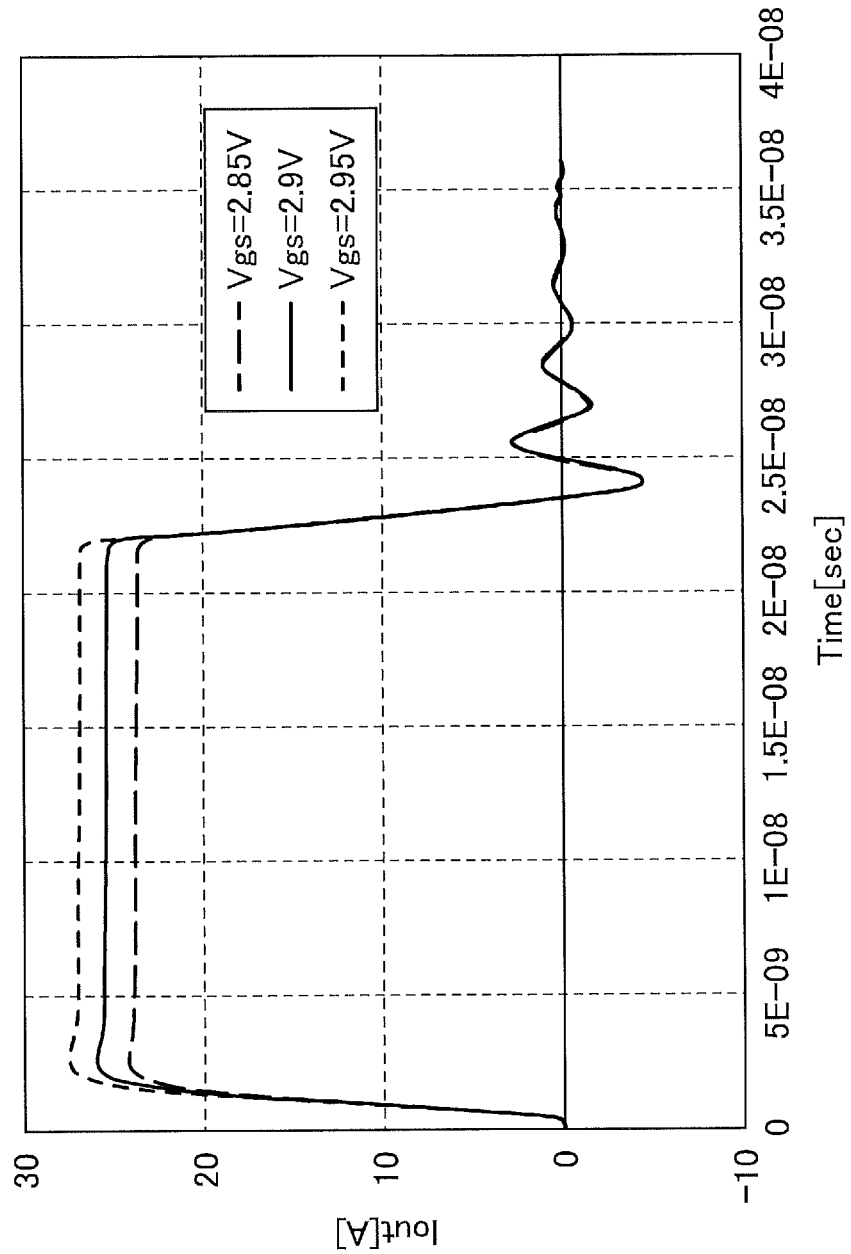
FIG. 7 is a graph illustrating an example of a current waveform of the lighting module illustrated in FIG. 2.

FIG. 7 is a graph illustrating an example of the current waveform in the lighting module 100 according to the present embodiment. As illustrated in FIG. 7, the lighting module 100 according to the present embodiment can change the gate voltage of the second FET 123, to change the resistance value of the second FET 123. Therefore, the amount of current flowing through the laser light source 131 can be adjusted for each waveform. In addition, the lighting module 100 according to the present embodiment can adjust the value of the voltage supplied to the drive circuit 120, to adjust the rise time of the current.

In a case of performing, for one FET, both high-speed turning on/off and control of the FET current value, control of the gate voltage value applied to the FET is complicated, which makes stable high-output and high-speed light output difficult.

As described above, in the lighting module 100 according to the present embodiment, the second FET 123 is used as the variable resistor. Thus, the current can be changed with a simple configuration without replacing a component for controlling the current value. Accordingly, even when the light output fluctuates due to the influence of fluctuation of the power supply voltage, deterioration over time, or the like, the lighting module 100 according to the present embodiment can adjust the current in accordance with the amount of fluctuation, so as to obtain a constant light output. Thus, high-output and high-speed light output can be stably performed, and the lighting module 100 can prevent deterioration of range finding accuracy due to a decrease in illuminance. In addition, the lighting module 100 according to the present embodiment can freely change the intensity of light emitted from the laser light source 131 in accordance with range finding distance, the object reflectance, or the like.

Figure 8:
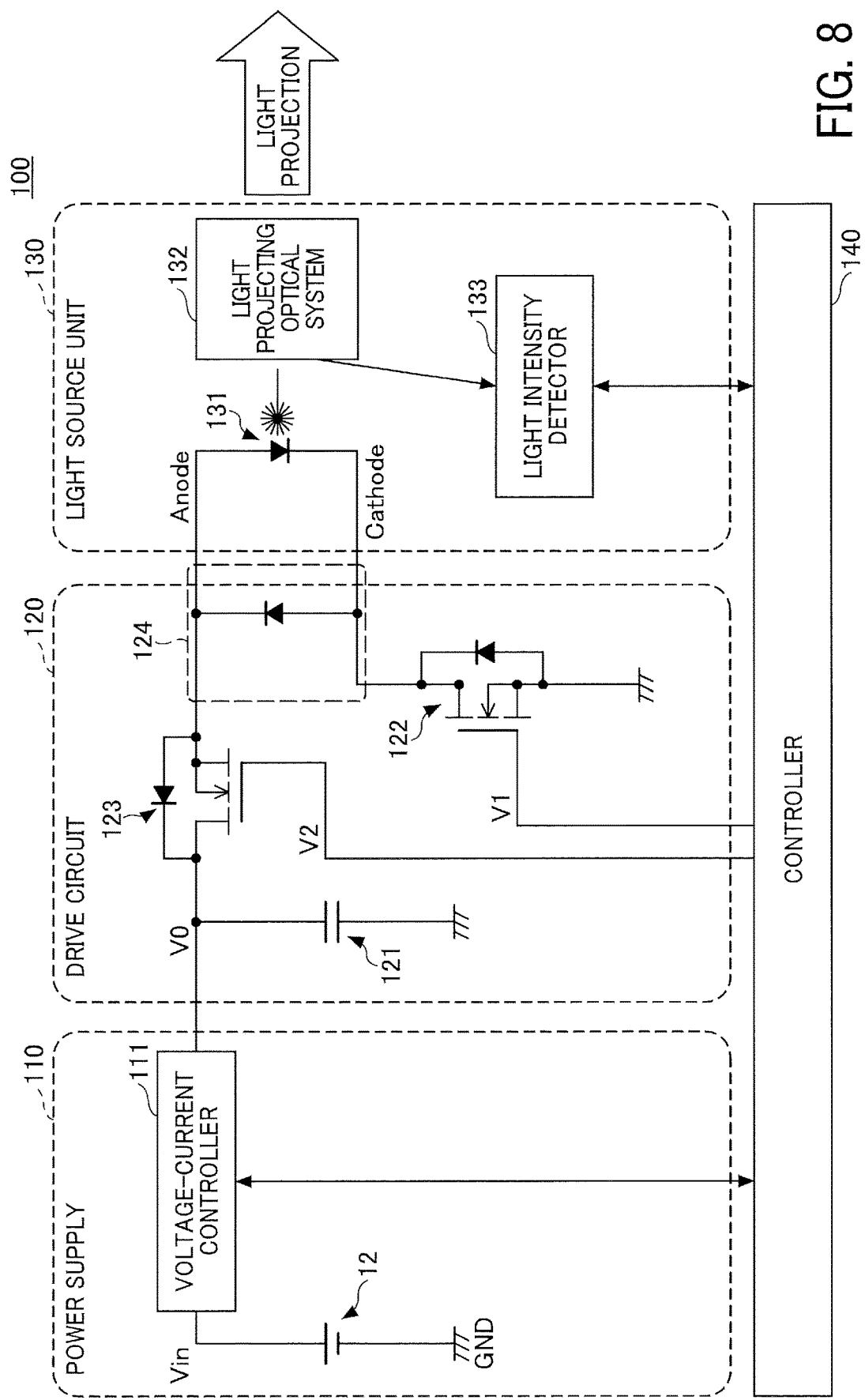
FIG. 8 is a diagram illustrating a first modification of a drive circuit illustrated in FIG. 2.

Modification of Drive Circuit FIG. 8 is a diagram illustrating a first modification of the drive circuit 120 according to the above-described embodiment. In the example illustrated in FIG. 8, the drive circuit 120 further includes a diode 124 connected in parallel with the laser light source 131.

Figure 9:
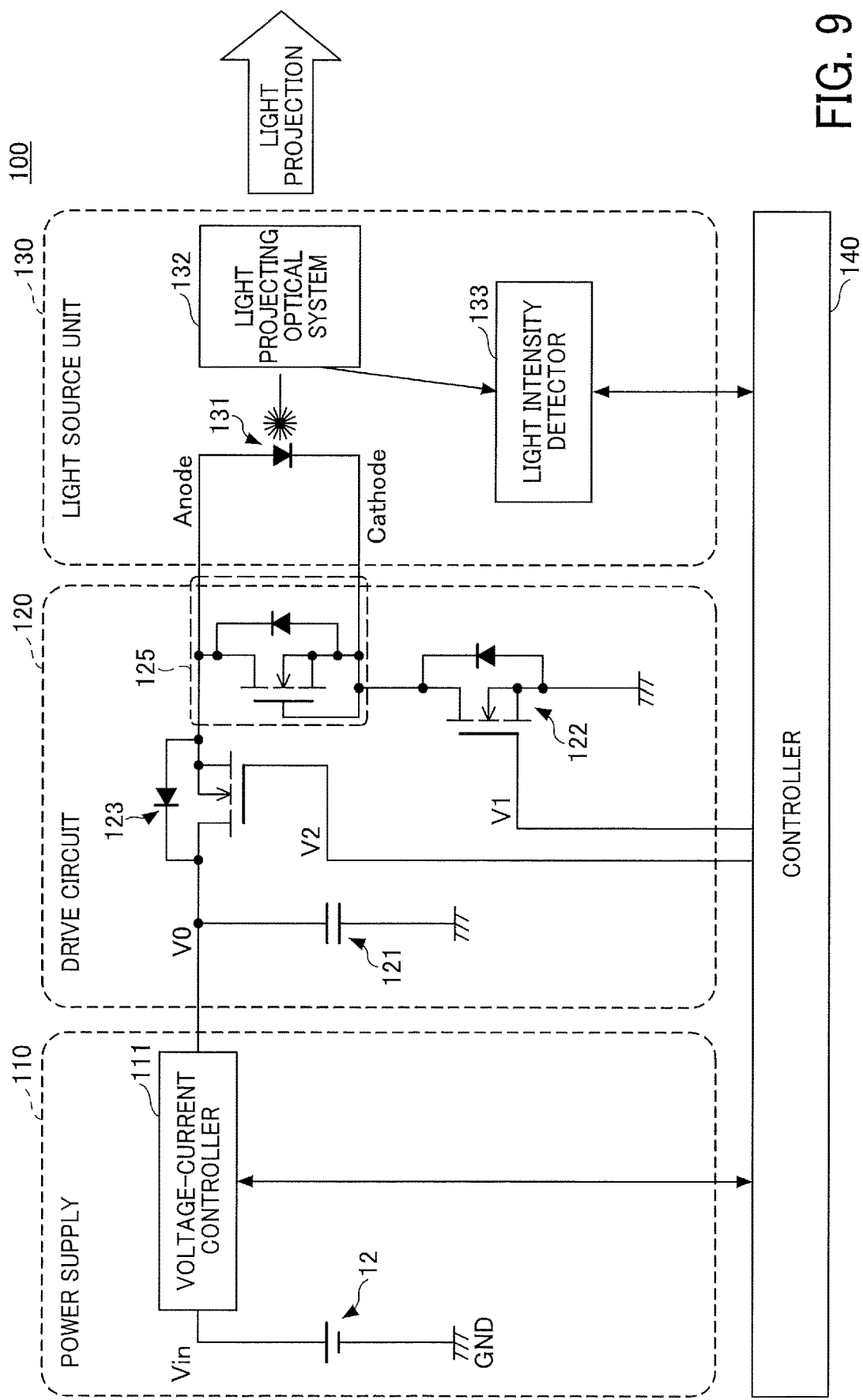
FIG. 9 is a diagram illustrating a second modification of the drive circuit illustrated in FIG. 2.

FIG. 9 is a diagram illustrating a second modification of the drive circuit 120 according to the above-described embodiment. In the example illustrated in FIG. 9, the drive circuit 120 further includes a third FET 125 connected in parallel with the laser light source 131.

In the examples illustrated in FIGS. 8 and 9, the drive circuit 120 including the diode 124 or the third FET 125 can increase the speed in cutting off the output current. Accordingly, the range finding accuracy can improve.

In addition, the drive circuit 120 including the diode 124 or the third FET 125 can inhibit surge voltage or surge current by performing reflux when the output current is cut off. Therefore, unexpected light emission and failure of the laser light source 131 and the first FET 122 and the second FET 123 can be prevented.

Figure 10:
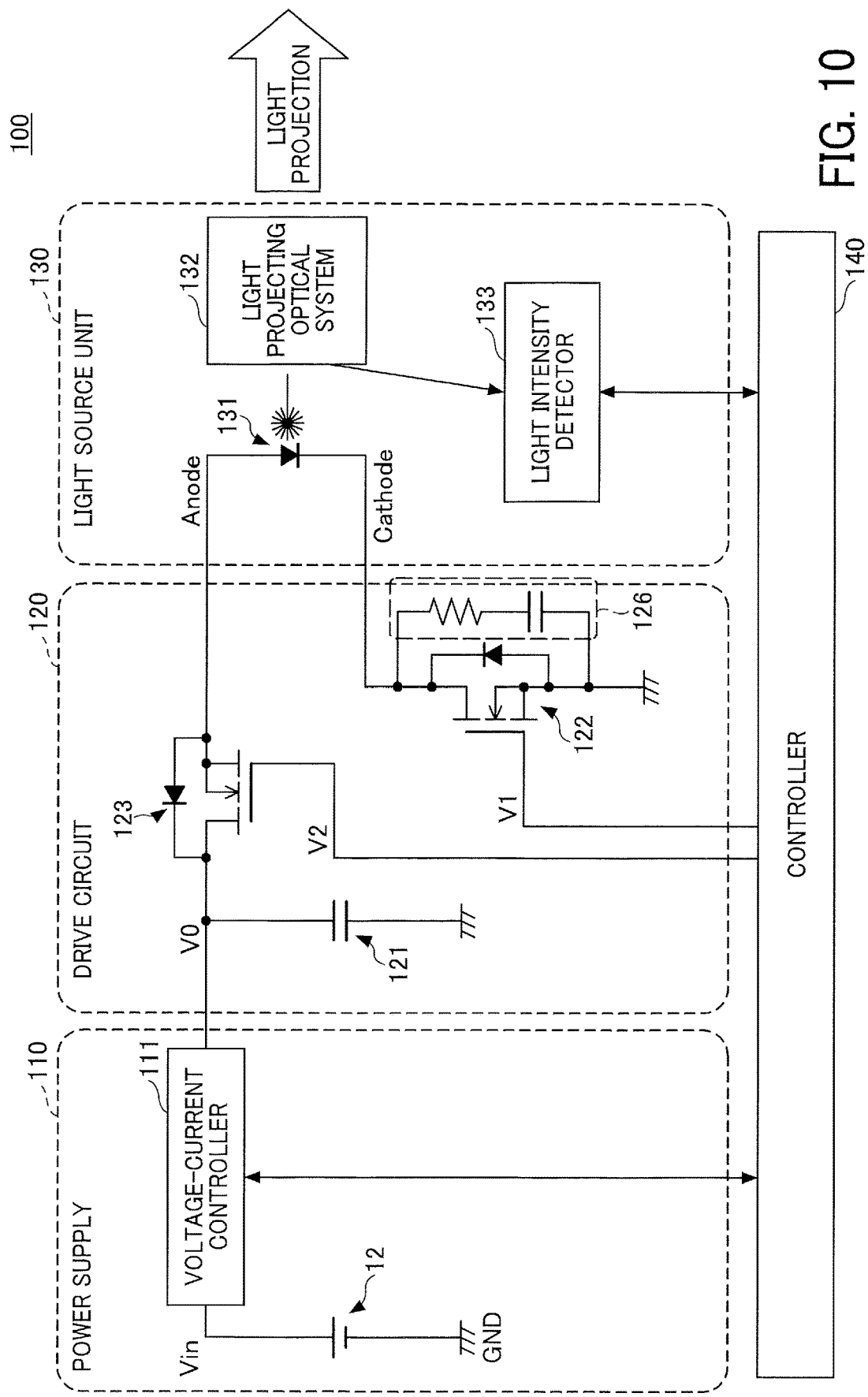
FIG. 10 is a diagram illustrating a third modification of the drive circuit illustrated in FIG. 2.

FIG. 10 is a diagram illustrating a third modification of the drive circuit 120 according to the above-described embodiment. In the example illustrated in FIG. 10, the drive circuit 120 further includes a snubber circuit 126 connected in parallel with the first FET 122.

Figure 11:
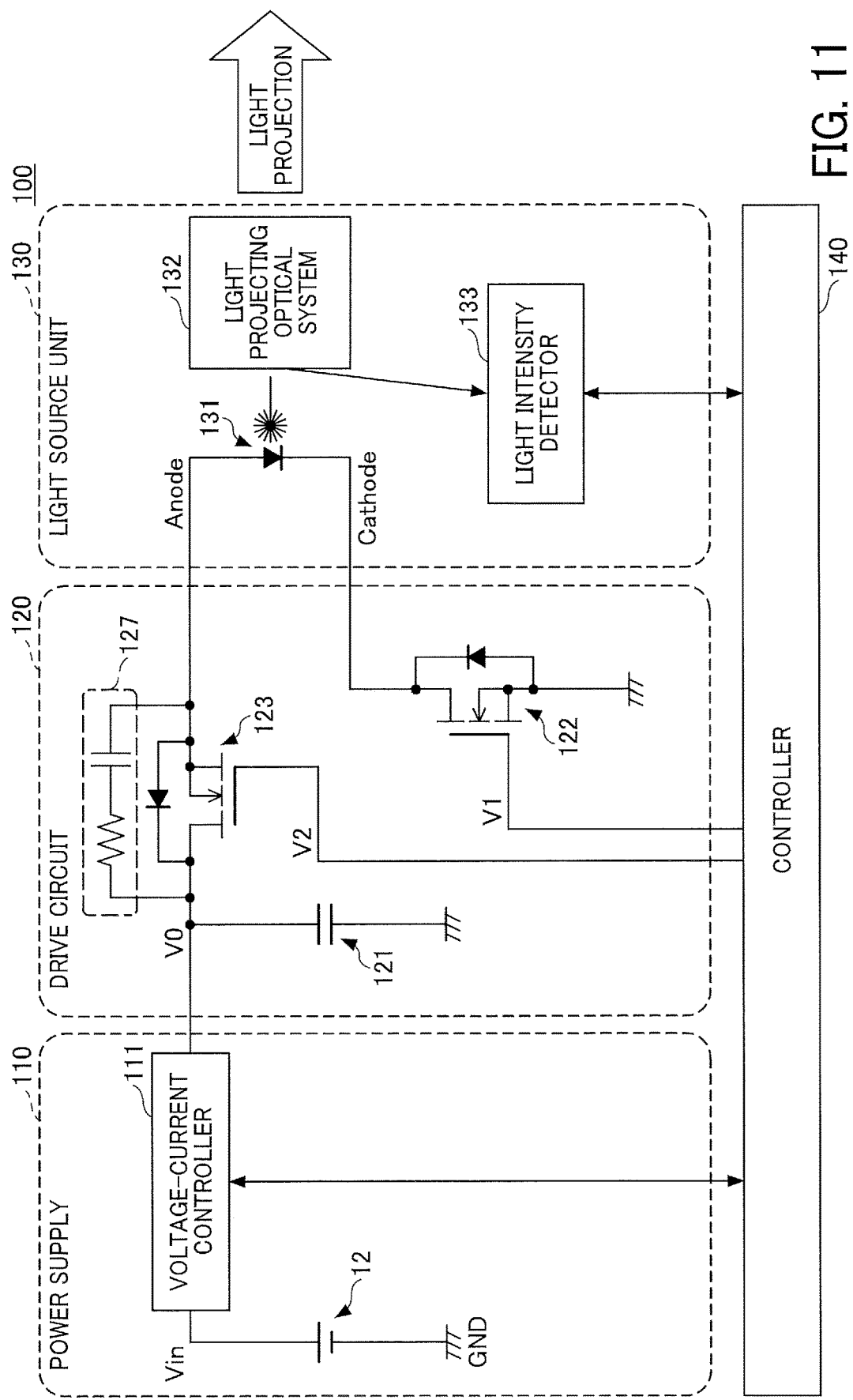
FIG. 11 is a diagram illustrating a fourth modification of the drive circuit illustrated in FIG. 2.

FIG. 11 is a diagram illustrating a fourth modification of the drive circuit 120 according to the above-described embodiment. In the example illustrated in FIG. 11, the drive circuit 120 further includes a snubber circuit 127 connected in parallel with the second FET 123.

As illustrated in FIGS. 10 and 11, the drive circuit 120 including one or both of the snubber circuits 126 and 127 can inhibit surge voltage and surge current, and can prevent unexpected light emission and failure of the laser light source 131 and one or both of the first FET 122 and the second FET 123.

In the examples illustrated in FIGS. 10 and 11, each of the snubber circuits 126 and 127 is a resistor-capacitor (RC) snubber circuit including a resistor and a capacitor, but may be a resistor-capacitor-diode (RCD) snubber circuit that further includes a diode in accordance with an output current value or a frequency.

Example of Heat Dissipation Structure

Figure 12:
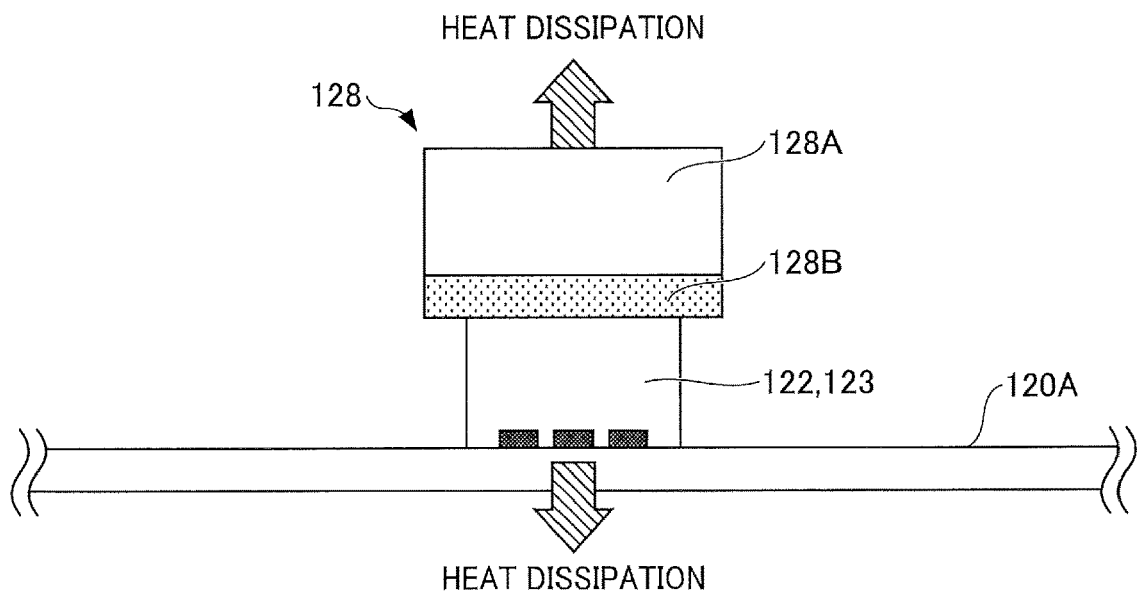
FIG. 12 is a diagram illustrating a first example of a heat dissipation structure of the FET of the lighting module illustrated in FIG. 2.
Figure 13:
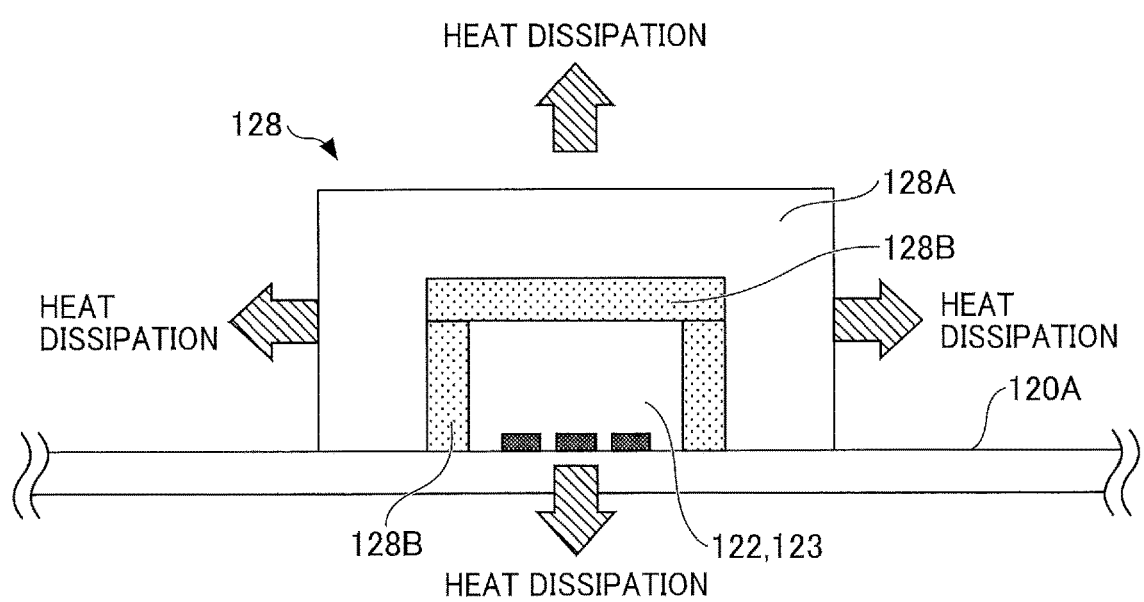
FIG. 13 is a diagram illustrating a second example of the heat dissipation structure of the FET of the lighting module illustrated in FIG. 2.

FIG. 12 is a diagram illustrating a first example of a heat dissipation structure of the first FET 122 and the second FET 123 in the lighting module 100 according to the above-described embodiment. FIG. 13 is a diagram illustrating a second example of the heat dissipation structure of the first FET 122 and the second FET 123 in the lighting module 100 according to the above-described embodiment.

In the examples illustrated in FIGS. 12 and 13, the first FET 122 and the second FET 123 are mounted on a mounting board 120A, and a radiator 128 is disposed on the surface of each of the first FET 122 and the second FET 123.

In the example illustrated in FIG. 12, the radiator 128 includes a contact portion 128B made of a conductor in contact with the upper surface of the first FET 122 (or the second FET 123) and a heat dissipating portion 128A disposed on the upper surface of the contact portion 128B. Thus, in the example illustrated in FIG. 12, the heat generated by the first FET 122 and the second FET 123 can be dissipated from the upper surfaces of the first FET 122 and the second FET 123 to above the radiators 128 via the radiators 128.

In the example illustrated in FIG. 13, the radiator 128 includes a contact portion 128B made of a conductor and disposed in contact with the upper surface and side surfaces of the first FET 122 (or the second FET 123) and a heat dissipating portion 128A overlying the surface of the contact portion 128B. In the example illustrated in FIG. 13, the radiators 128 can dissipate the heat generated by the first FET 122 and the second FET 123 from the upper surfaces and the side surfaces of the first FET 122 and the second FET 123 to the upper side and the side of the radiators 128.

In the radiators 128 illustrated in FIG. 12 and FIG. 13, the contact portion 128B has conductivity. This structure can enhance the thermal conductivity and enhance the heat dissipation effect of the first FET 122 and the second FET 123 (variable resistors), compared with the case where the contact portion 128B is not heat-conductive. In the present embodiment, the first FET 122 and the second FET 123 are GaN FETs, which has a terminal on not the front side but the bottom side (board mounting side). Accordingly, the contact portions 128B that are heat-conductive can be disposed in contact with the surfaces of the first FET 122 and the second FET 123.

The above-described embodiments are illustrative and do not limit the present invention. Thus, numerous additional modifications and variations are possible in light of the above teachings within the scope of the appended claims.

Ranging Device

Figure 14:
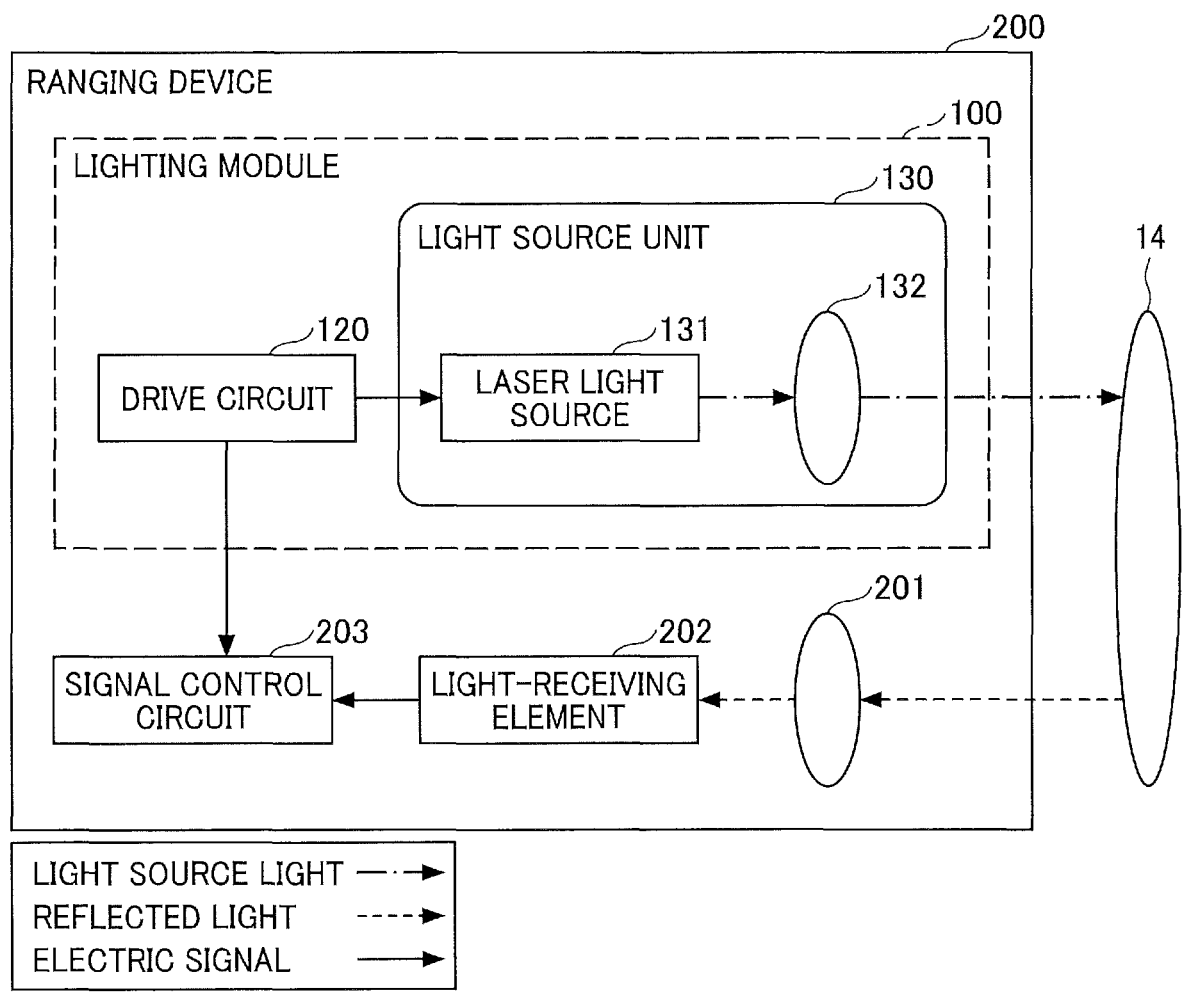
FIG. 14 is a block diagram illustrating a configuration of a ranging device including the lighting module according to one embodiment of the present disclosure.

As a first application example, the lighting module 100 is applied to a ranging device 200 (a distance measuring device) illustrated in FIG. 14. FIG. 14 is a block diagram illustrating a configuration of the ranging device 200 including the lighting module 100 according to one of the above-described embodiment. In FIG. 14, solid-line arrows indicate the flow of electric signals, broken-line arrows indicate the path of reflected light, and alternate long and short dashed line arrows indicate the path of light from the laser light source 131.

As illustrated in FIG. 14, the ranging device 200 includes the lighting module 100 described above, a light-receiving optical system 201, a light-receiving element 202, and a signal control circuit 203. In FIG. 14, the power supply 110 and the controller 140 of the lighting module 100 are omitted for simplicity.

The ranging device 200 is a time-of-flight (TOF) distance measuring device that emits laser light (pulsed light) from the light source unit 130 of the lighting module 100 to a detection target 14, receives the reflected light from the detection target 14 with the light-receiving element 202, and measures the distance to the detection target 14 based on the time required for receiving the reflected light.

The drive circuit 120 of the lighting module 100 transmits a light emission signal to the signal control circuit 203 to cause the laser light source 131 to emit light.

The light that is emitted from the light source unit 130 and then reflected by the detection target 14 is guided to the light-receiving element 202 through the light-receiving optical system 201 that has a light focusing effect. The light-receiving element 202 includes a photoelectric conversion element. The light-receiving element 202 generates a light reception signal through photoelectric conversion of the received light and transmits the light reception signal to the signal control circuit 203.

The signal control circuit 203 calculates the distance to the detection target 14 based on the time difference between the light emission time (the time at which the light emission signal is input from the drive circuit 120) and the light reception time (the time at which the light reception signal is input from the light-receiving element 202).

Since the ranging device 200 configured as described above includes the lighting module 100, the stability of the range finding accuracy can improve.

Motor Vehicle

Figure 15:
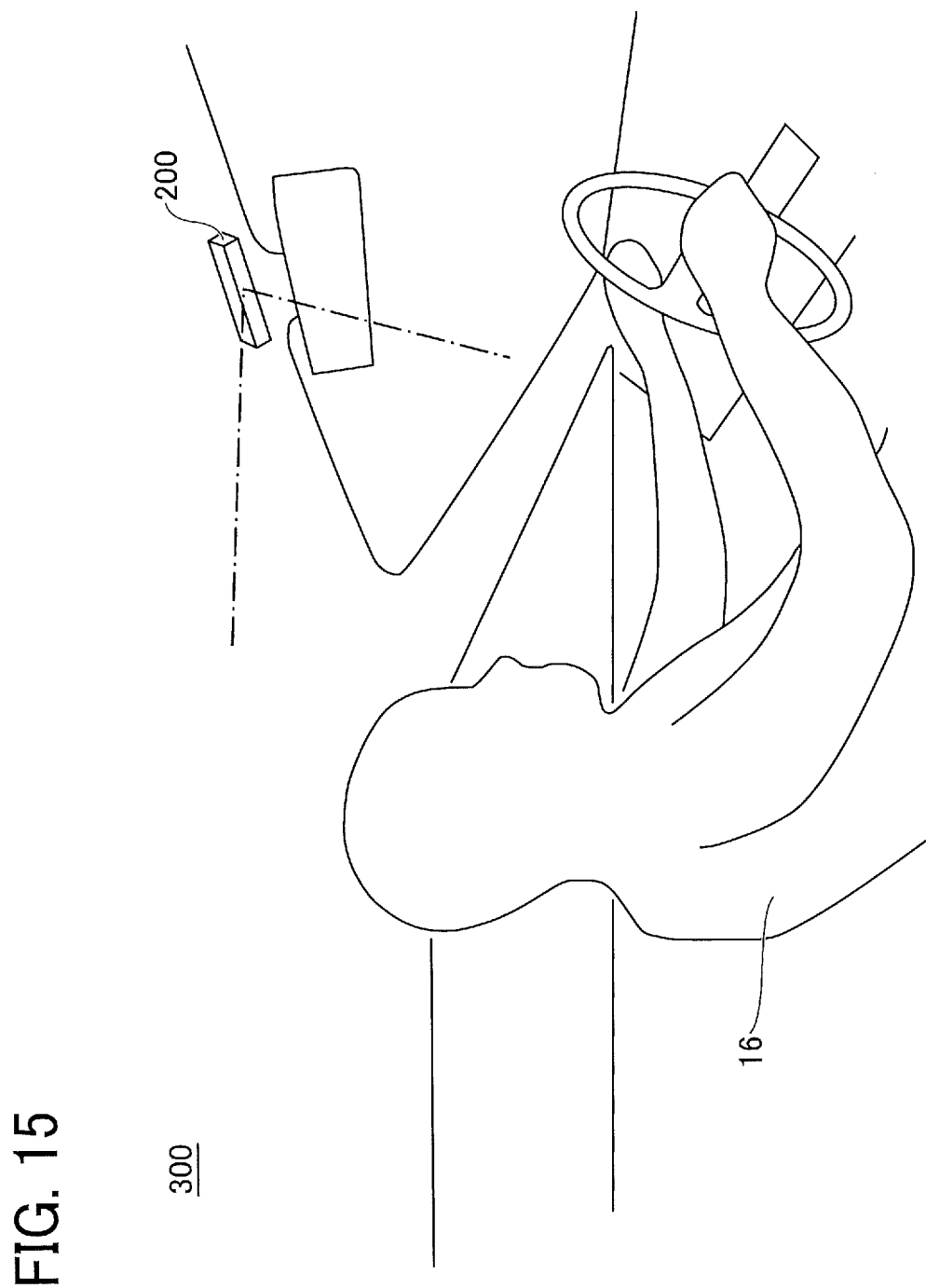
FIG. 15 is a view illustrating a motor vehicle including the ranging device illustrated in FIG. 14.

As a second application example, the ranging device 200 illustrated in FIG. 14 is applied to a motor vehicle 300. FIG. 15 is a view illustrating the motor vehicle 300 including the ranging device 200 illustrated in FIG. 14.

As illustrated in FIG. 15, the ranging device 200 illustrated in FIG. 14 is mounted inside the motor vehicle 300 (an example of a "movable body"). The ranging device 200 emits laser light (pulsed light) from the light source unit 130 toward a driver 16 of the motor vehicle 300. Thus, the ranging device 200 can measure the distance to the driver 16. Note that the ranging device 200 may emit laser light (pulsed light) toward the outside of the motor vehicle 300. Thus, the ranging device 200 can measure the distance to the detection target outside the motor vehicle 300.

The motor vehicle 300 including the ranging device 200 can improve the sensing accuracy of the detection target, and, for example, can improve the effect of preventing an accident.

Note that the lighting module 100 and the ranging device 200 can be applied, not limited to the examples described above, but also to, for example, a detection device for article inspection in a factory, a detection device for operation control of a movable device, and a detection device for user authentication of an electronic device.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention. Each of the functions of the described embodiments may be implemented by one or more processing circuits or circuitry. Processing circuitry includes a programmed processor, as a processor includes circuitry. A processing circuit also includes devices such as an application specific integrated circuit (ASIC), a digital signal processor (DSP), a field programmable gate array (FPGA), and conventional circuit components arranged to perform the recited functions.

The invention claimed is:

1. A lighting module comprising:
a voltage-current controller configured to control a voltage value and a current value of power supplied from an external power supply;
a capacitor to be charged with power supplied from the voltage-current controller;
a laser light source configured to emit laser light, driven by a current supplied from the capacitor;
a first field effect transistor electrically connected in series to the laser light source,
the first field effect transistor being configured to control a pulse width of the current flowing through the laser light source in accordance with a first voltage value applied to a gate of the first field effect transistor;
a second field effect transistor electrically connected in series to the laser light source,
the second field effect transistor being configured to:
change in resistance value in accordance with a second voltage value applied to a gate of the second field effect transistor; and
control, with the resistance value, a peak value of the current flowing through the laser light source; and
circuitry configured to:
control the first voltage value applied to the first field effect transistor; and
control the second voltage value applied to the second field effect transistor, to control the resistance value of the second field effect transistor.

2. The lighting module according to claim 1,
wherein the second field effect transistor includes a material having a bandgap equal to or greater than 3 eV.

3. The lighting module according to claim 1, further comprising a light-receiving element configured to detect an intensity of the laser light emitted from the laser light source,
wherein the circuitry controls the second voltage value applied to the second field effect transistor in accordance with the intensity of the laser light detected by the light-receiving element.

4. The lighting module according to claim 1, further comprising a radiator disposed in contact with a surface of at least one of the first field effect transistor and the second field effect transistor, to radiate heat of the at least one of the first field effect transistor.

5. The lighting module according to claim 1,
wherein the laser light source is a surface-emitting laser.

6. The lighting module according to claim 1,
wherein the laser light source is an edge-emitting laser.

7. The lighting module according to claim 1, further comprising a diode connected in parallel with the laser light source.

8. The lighting module according to claim 1, further comprising a third field effect transistor connected in parallel with the laser light source.

9. The lighting module according to claim 1, further comprising a snubber circuit connected in parallel with the first field effect transistor.

10. The lighting module according to claim 1, further comprising a snubber circuit connected in parallel with the second field effect transistor.

11. A distance measuring device comprising the lighting module according to claim 1.

12. A movable body comprising the distance measuring device according to claim 11.

13. A light source drive circuit configured to drive a laser light source, the light source drive circuit comprising:
- a capacitor configured to be charged with power supplied from an external power supply, to accumulate power supplied to the laser light source;
- a first field effect transistor electrically connected in series to the laser light source,
  the first field effect transistor being configured to control a pulse width of a current flowing through the laser light source in accordance with a first voltage value applied to a gate of the first field effect transistor; and
- a second field effect transistor electrically connected in series to the laser light source,
  the second field effect transistor being configured to:
    change in resistance value in accordance with a second voltage value applied to a gate of the second field effect transistor; and
    control, with the resistance value, a peak value of the current flowing through the laser light source.

14. The light source drive circuit according to claim 13, wherein the second field effect transistor includes a material having a bandgap equal to or greater than 3 eV.

* * * * *